United States Patent [19]

Fukuda et al.

[11] Patent Number: 4,498,054
[45] Date of Patent: Feb. 5, 1985

[54] DIFFERENTIAL AMPLIFIER CIRCUIT

[75] Inventors: Hirokazu Fukuda, Yokohama; Masaru Hashimoto, Ayase, both of Japan

[73] Assignee: Tokyo Shibaura Denki Kabushiki Kaisha, Japan

[21] Appl. No.: 526,822

[22] Filed: Aug. 26, 1983

[30] Foreign Application Priority Data

Aug. 31, 1982 [JP] Japan ................... 57-150987

[51] Int. Cl.³ .............................................. H03F 3/45
[52] U.S. Cl. .................................... 330/261; 330/252
[58] Field of Search ............... 330/252, 254, 257, 261

[56] References Cited

FOREIGN PATENT DOCUMENTS

48-81457  1/1972  Japan.
0109358  8/1979  Japan .................................. 330/254

Primary Examiner—James B. Mullins
Assistant Examiner—G. Wan
Attorney, Agent, or Firm—Finnegan, Henderson, Farabow, Garrett & Dunner

[57] ABSTRACT

A differential amplifier circuit includes first and second differential amplifiers, with respective first input terminals thereof connected to each other and first and second current sources for supplying first and second drive currents to drive the first and second amplifiers respectively. The first and second drive currents are set such that their sum is constant. The differential amplifier circuit further includes first and second transistors with the bases thereof connected to second input terminals of the first and second amplifiers respectively and third and fourth current sources respectively connected to the current paths of the first and second transistors and supplying third and fourth drive currents equal to one half the respective second and first drive currents.

8 Claims, 7 Drawing Figures

DIFFERENTIAL AMPLIFIER CIRCUIT

BACKGROUND OF THE INVENTION

This invention relates to a differential amplifier circuit, which has two differential amplifier sections and selectively provides one of the output signals of these sections.

Figure 1:
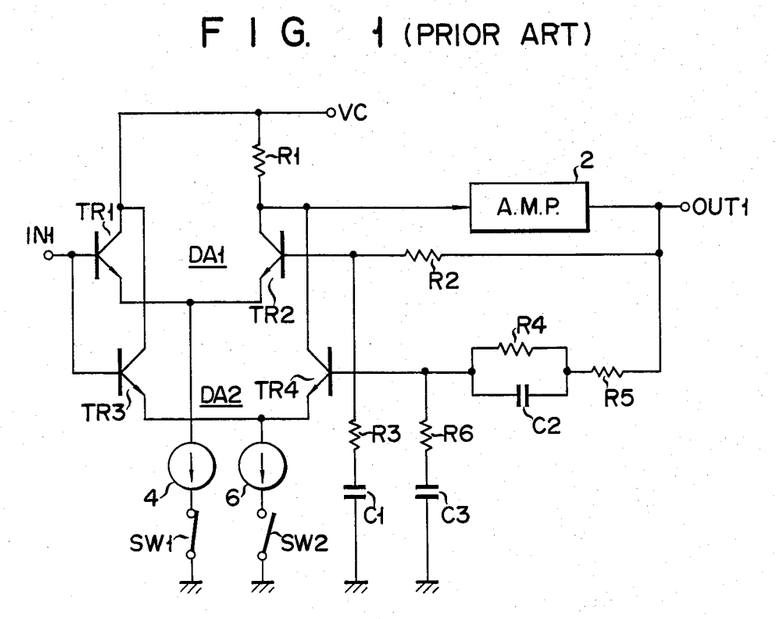
FIG. 1 is a circuit diagram showing a prior art differential amplifier circuit capable of selectively providing one of two different equalizing characteristics.

FIG. 1 shows a prior art differential amplifier circuit with an equalizing characteristic switching function, which is used as a preamplifier in a tape recorder. The operational state of this amplifier circuit is set to provide flat frequency characteristics in a recording mode and provide frequency characteristics defined by the NAB standards or like standards in a playback mode.

The differential amplifier circuit includes a differential amplifier DA1 constituted by a pair of npn transistors TR1 and TR2 and another differential amplifier DA2 constituted by a pair of npn transistors TR3 and TR4. The transistors TR1 and TR3 have their bases commonly connected to an input terminal IN1 and their collectors commonly connected to a power supply terminal VC. The transistors TR2 and TR4 have their collectors commonly connected through a resistor R1 to the power supply terminal VC and also commonly connected through an output amplifier 2 to an output terminal OUT1. The transistors TR1 and TR2 have their emitters grounded through a constant current source 4 and a switch SW1. The transistors TR3 and TR4 have their emitters grounded through a constant current source 6 and a switch SW2. The switches SW1 and SW2 are set in mutually opposite switching positions. The transistor TR2 has a base connected through a resistor R2 to the output terminal of the output amplifier 2 and also grounded through a series circuit of a resistor R3 and a capacitor C1. The transistor TR4 has a base connected, through a parallel circuit of a resistor R4 and a capacitor C2 and a resistor R5, to the output terminal of the output amplifier 2 and also grounded through a series circuit of a resistor R6 and a capacitor C3. The resistors R2 and R3 and capacitor C1 form a feedback path having flat frequency characteristics. The resistors R5, R4 and R6 and capacitors C2 and C3 form a feedback path having frequency characteristics defined by the NAB standards. When the switch SW1 is "on", the differential amplifier circuit of FIG. 1 provides flat frequency characteristics, and when the switch SW2 is "on", it provides the frequency characteristics defined by the NAB standards.

Figure 2:
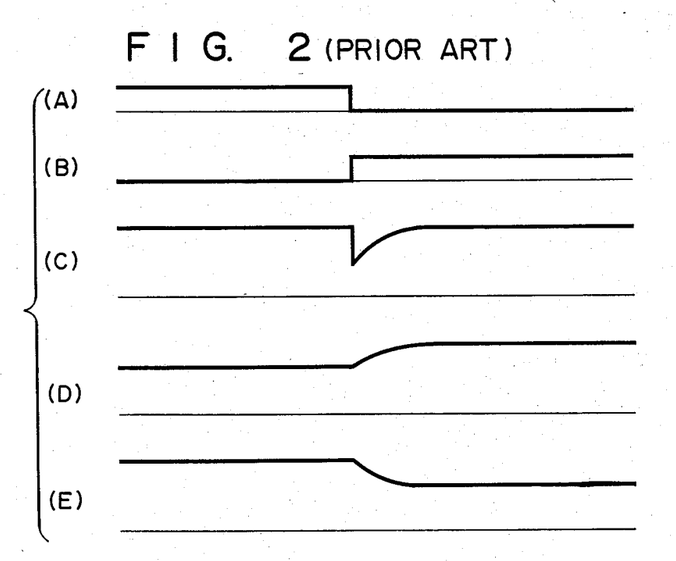
FIG. 2 is a waveform chart illustrating the operation of the differential amplifier circuit shown in FIG. 1.

It is now assumed that the switches SW1 and SW2 are respectively "on" and "off" so that the constant current source 4 supplies a constant current as shown in FIG. 2 (A) while a constant current from the constant current source 6 is interrupted as shown in FIG. 2 (B), that is, the differential amplifier DA1 is operative while the differential amplifier DA2 is inoperative. In this situation, the DC base potentials of the transistors TR1 and TR2 of the differential amplifier DA1 are substantially at an equal potential, and a base current flows through the resistor R2 to the base of the transistor TR2. The DC potential on the output terminal OUT1 is thus held at a level equal to the sum of the base potential of the transistor TR2 as shown in FIG. 2 (D) and the voltage drop across the resistor R3 due to the base current, as shown in FIG. 2 (C). In the differential amplifier DA2, the transistor TR4 carries no current, so that the base thereof is held at a fixed potential level equal to the DC potential on the output terminal OUT1 as shown in FIG. 2 (E). The capacitor C3 is charged to a voltage corresponding to the DC potential level on the output terminal OUT1.

When the switches SW1 and SW2 are switched to "off" and "on", respectively, the differential amplfifiers DA1 and DA2 are rendered inoperative and operative, respectively. At this time, the base potential of the transistor TR4 is set at a level higher than the base potential of the transistor TR3 due to the charge in the capacitor C3. More specifically, the base potential of the transistor TR4 is set at a level higher than that of the transistor TR3 by the voltage drop $\Delta VB$ across the resistor R2 which occurs before the switching action due to the current flowing to the base of the transistor TR2. This voltage $\Delta VB$ is amplified to $(R4+R5+R6)/R6$ times $\Delta VB$ by the differential amplifier DA2 and then supplied through the amplifier 2 to an external loudspeaker circuit (not shown). An impulse sound is thus generated from the loudspeaker circuit.

As the capacitor C3 is subsequently discharged, the base potential on the transistor TR4 is reduced to a predetermined level as shown in FIG. 2 (E) and held at this level.

Figure 3:
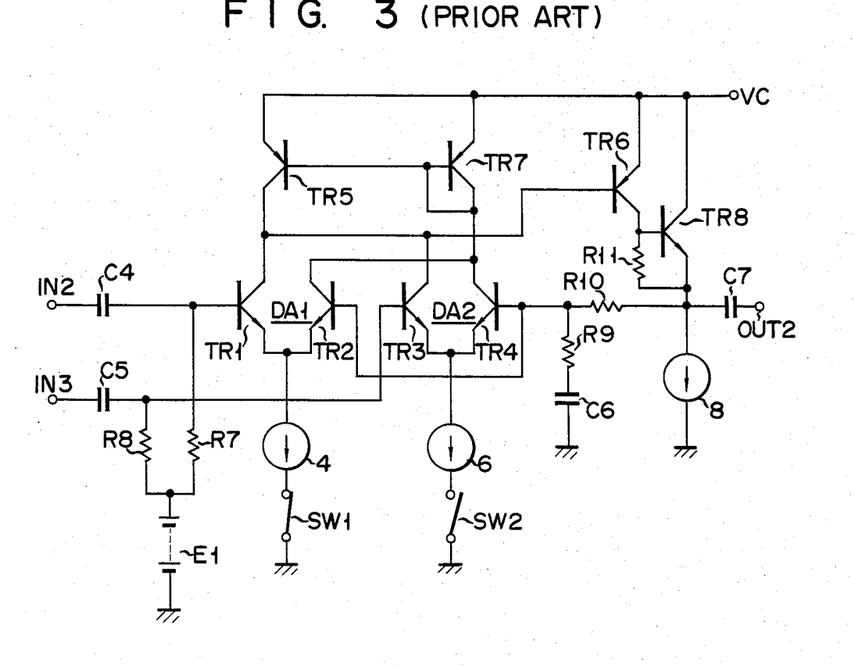
FIG. 3 is a circuit diagram showing a prior art differential amplifier circuit capable of selectively amplifying one of input signals.

FIG. 3 shows a prior art differential amplifier circuit, which can selectively amplify one of two input signals. Like the differential amplifier circuit shown in FIG. 1, this amplifier circuit includes a differential amplifier DA1 having npn transistors TR1 and TR2, and another differential amplifier DA2 having npn transistors TR3 and TR4, constant current sources 4 and 6 and switches SW1 and SW2. The transistors TR1 and TR3 have their bases connected through capacitors C4 and C5 to input terminals IN2 and IN3 and also connected through resistors 27 and 28 to the positive terminal of a power supply E1, respectively. The transistors TR2 and TR4 have their bases grounded through a resistor R9 and a capacitor C6 and also commonly connected through a resistor R10 and a capacitor C7 to an output terminal OUT1. The transistors TR1 and TR3 have collectors commonly connected to the collector of a pnp transistor TR5 whose emitter is connected to a power supply terminal VC, and also to the base of a pnp transistor TR6 whose emitter is connected to the power supply terminal VC. The transistors TR2 and TR4 have collectors commonly connected to the collector and base of a pnp transistor TR7 whose emitter is connected to the power supply terminal VC and whose base is connected to the base of the transistor TR5. The transistor TR6 has a collector connected to the base of an npn transistor TR8 whose collector is connected to the power supply terminal VC, and is also connected through a resistor R11 to the emitter of the transistor TR8. The emitter of the transistor TR8 is further connected to the connection point between a resistor R10 and a capacitor C7 and also to a constant current source 8.

When the switch SW1 is "on", the differential amplifier circuit amplifies the input signal fed to the input terminal IN2. When the switch SW2 is "on", it amplifies the input signal fed to the input terminal IN3. When the switch SW1 is "on", the differential amplifier DA1 is operative, and a base current flows through the resistor R7 into the base of the transistor TR1. The base of the transistor TR1 is thus held at a DC base potential equal to the difference between the output voltage V0 of the power supply E1 and the voltage drop across the resistor R7. Also, the base potential of the transistor TR3 is held at a level equal to the voltage V0, and the base potentials of the transistors TR2 and TR4 are set equal to the DC base potential of the transistor TR1. When the switches SW1 and SW2 are set to "off" and "on" positions respectively, different voltages are applied to the bases of transistors TR3 and TR4, and the difference between these base potentials is amplified by the differential amplifier DA2. The amplified voltage is supplied through an output circuit constituted by the transistors TR6 and TR8 to the output terminal OUT2.

In the amplifier circuits of FIGS. 1 and 3, the switching of the switches SW1 and SW2 causes a sudden change of the DC voltage on the output terminal, so that an impulse sound will be produced from the loudspeaker circuit connected to the output terminal as mentioned earlier.

SUMMARY OF THE INVENTION

An object of the invention is to provide a differential amplifier circuit, in which the change in the DC output voltage at the time of the switching of operation modes is suppressed to a minimum level.

This object of the invention is attained by a differential amplifier circuit which includes a first differential amplifier having first and second input terminals and an output terminal, a second differential amplifier having a first input terminal and an output terminal connected to the first input terminal and output terminal of the first differential amplifier respectively, and a second input terminal, first and second variable current sources respectively connected to the first and second differential amplifiers, for supplying first and second drive currents with the sum thereof being constant to the first and second differential amplifiers, respectively. First and second transistors having bases connected to the second input terminals of the first and second differential amplifiers, and third and fourth current sources respectively connected to the emitter-collector paths of the first and second transistors, for supplying third and fourth drive currents changing in proportion to the respective second and first drive currents respectively.

DETAILED DESCRIPTION OF THE PREFERRED EMBODIMENTS

FIG. 3 illustrates the principles underlying an embodiment of the differential amplifier circuit according to the invention. It includes a differential amplifier DA3 having npn transistors TR10 and TR11, another differential amplifier DA4 having npn transistors TR12 and TR13, and transistors TR14 and TR15 having bases connected to the bases of the transistors TR10 and TR12 respectively. The transistors TR10 and TR11 have emitters grounded through a variable current source 10. The transistors TR12 and TR13 have emitters grounded through a variable current source 11. The transistors TR14 and TR15 have emitters grounded through respective variable current sources 12 and 13. The transistors TR10 and TR14 have bases commonly connected to a first signal input terminal SIT1. The transistors TR11 and TR13 have bases commonly connected to a second signal input terminal SIT2. The transistors TR12 and TR15 have bases commonly connected to a third signal input terminal SIT3. The transistors TR10 and TR12 have collectors commonly connected to a first signal output terminal SOT1. The transistors TR11 and TR13 have collectors commonly connected to a second signal output terminal SOT2. The transistors TR14 and TR15 have collectors commonly connected to the power supply terminal VC.

Currents I1 and I4 from the variable current sources are set to satisfy the following relations:

$$I3 = I2/2 \quad (1)$$

$$I4 = I1/2 \quad (2)$$

and $$I1 + I2 = k \quad (3)$$

where k is a constant.

The equations (1) and (3) are rewritten as follows:

$$I2 = k - I1 \quad (4)$$

and $$I3 = (k - I1)/2 \quad (5)$$

Denoting the current amplification factor of the transistors TR10 and TR15 by $\beta$ and the DC input current components supplied to the signal input terminals SIT1 to SIT3 by IS1 to IS3, the following equations can be obtained:

$$IS1 = 1/\beta\{(K-I1)/2 + I1/2\} = k/2\beta \quad (6)$$

$$IS2 = 1/\beta\{(K-I1)/2 + I1/2\} = k/2\beta \quad (7)$$

and $$IS3 = 1/\beta(I1/2 + (K-I1)/2) = k/2\beta \quad (8)$$

Obviously from the equations (6) to (8), the DC currents IS1 to IS3 flowing through the input terminals IN1 to IN3 are kept constant irrespective of the values of the currents I1 to I4 in the variable current sources 10 to 13. Thus, even when the operation modes are changed over to render the differential amplifiers DA3 and DA4 operative and inoperative, respectively, by changing the current I1 from 0 to k, for instance, the sum of the base currents in the transistors TR10 and TR14, the sum of the base currents in the transistors TR11 and TR13 and the sum of the base currents in the transistors TR12 and TR15 are not varied but remain constant. Therefore, no sudden change occurs in the potentials on the signal output terminals SOT1 and SOT2.

Figure 4:
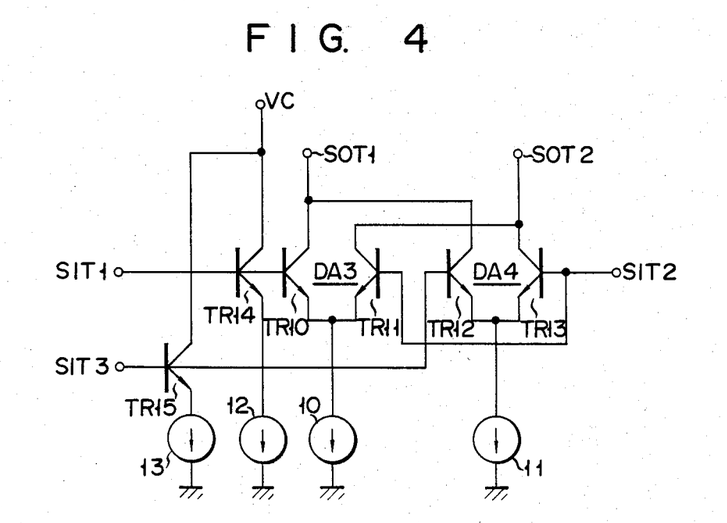
FIG. 4 is a circuit diagram showing the basic circuit of an embodiment of the differential amplifier circuit according to the invention which is capable of being set in one of two different operation modes.
Figure 5:
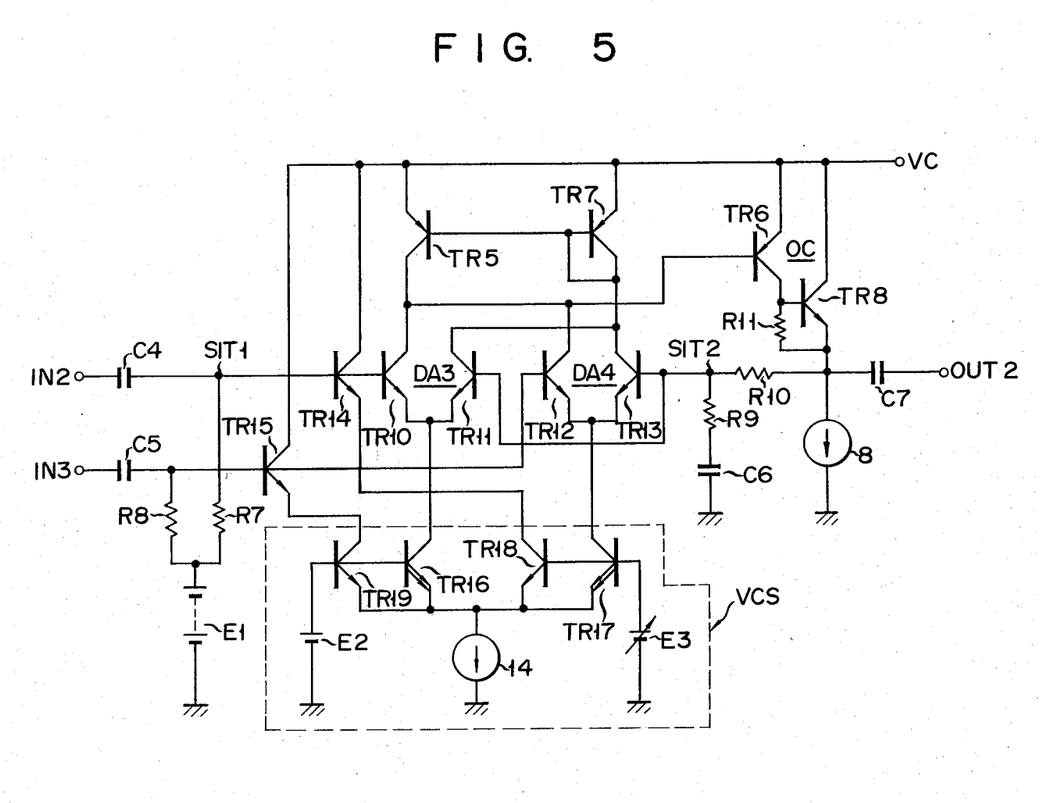
FIG. 5 is a circuit diagram showing an embodiment of the differential amplifier circuit according to the invention which is capable of selectively amplifying one of two input signals.

FIG. 5 shows an embodiment of the amplifier circuit according to the invention. It is so constructed on the basis of the circuit shown in FIG. 4, as to selectively amplify one of two input signals, and is an improvement over the amplifier circuit shown in FIG. 3. Like parts in the Figure are designated by the same reference numerals.

This circuit, like the circuit shown in FIG. 4, has npn transistors TR10 to TR15 connected in the same manner. The transistors TR10 and TR11 in this instance have emitters connected to the collector of a double-emitter npn transistor TR16. The transistors TR12 and TR13 have emitters connected to the collector of a double-emitter npn transistor TR17. The transistors TR14 and TR15 have emitters connected to the collectors of the transistors TR18 and TR19, respectively. The emitters of the transistors TR16 to TR19 are grounded through a constant current source 14.

The transistors TR10 and TR14 have bases commonly connected through a capacitor C4 to an input terminal IN2 and also through a resistor R7 to the positive terminal of a DC power supply E1. The transistors TR11 and TR13 have bases commonly connected through a resistor R10 and a capacitor C7 to an output terminal OUT2 and grounded through a resistor R9 and a capacitor C6. The transistors TR12 and TR15 have bases commonly connected through a capacitor C5 to an input terminal IN3 and also through a resistor R8 to the positive terminal of the DC power supply E1. The transistors TR16 and TR19 have bases commonly connected to a positive terminal of a DC power supply E2. The transistors TR17 and TR18 have bases connected to a positive terminal of a variable DC power supply E3.

The transistors TR10 and TR12 have collectors commonly connected to the slave current path of a current mirror circuit CMC constituted by npn transistors TR5 and TR7, i.e., to the collector of the transistor TR5, and also to an output circuit OC which is constituted by a pnp transistor TR6, a npn transistor TR8 and a resistor R11. The transistors TR11 and TR13 have collectors commonly connected to the master current path of the current mirror circuit CMC, i.e., to the collector of the transistor TR7.

The connection point between the resistor R10 and capacitor C7 is connected to the emitter of the transistor TR8 in the output circuit OC and also grounded through a constant current source 8.

The transistors TR16 to TR19, DC power supplies E2 and E3 and constant current source 14 form a variable current source circuit VCS for driving the differential amplifiers DA3 and DA4 and transistors TR14 and TR15. The output signal of the differential amplifiers DA3 and DA4 are fed through the output circuit OC and capacitor C7 to the output terminal OUT2 and are also fed back through a feedback circuit constituted by the resistors R10 and R9 and a capacitor C6 to the bases of the transistors TR11 and TR12.

When the output voltage V1 of the DC power supply E3 is sufficiently lower than the output voltage V2 of the DC power supply E2, the transistors TR16 and TR19 are rendered conductive while the transistors TR17 and TR18 are rendered nonconductive. In other words, in this case the differential amplifier DA3 and transistor TR15 are set operative while the differential amplifier DA4 and transistor TR14 are set inoperative. In this embodiment, the emitter area ratio between the transistors TR16 and TR19 is set at 2:1, so that the emitter current IE1 and IE2 flowing in the transistors TR16 and TR19 are expressed as follows:

$$IE1 + IE2 = I5 \tag{9}$$

$$IE1 = \tfrac{2}{3} \cdot I5 \tag{10}$$

and $$IE2 = \tfrac{1}{3} \cdot I5 \tag{11}$$

where I5 is the current flowing in the constant current source 14.

Where the current amplification factor $\beta$ of the transistors TR16 and TR19 is above 100, the collector currents IC1 and IC2 of the transistors TR16 and TR19 are given as follows:

$$IC1 \approx IE1 = \tfrac{2}{3} \cdot I5 \tag{12}$$

and $$IC2 \approx IE2 = \tfrac{1}{3} \cdot I5 \tag{13}$$

Under this condition, the input signal supplied to the input terminal IN2 is amplified by an amplifier circuit constituted by the differential amplifier DA3 and current mirror circuit CMC and then fed through the output circuit OC and coupling capacitor C7 to the output terminal OUT2.

When the output voltage V1 of the DC power supply E3 is at a sufficiently high level compared to the output voltage V2 of the DC power supply E2, the transistors TR17 and TR18 are rendered conductive so that the differential amplifier DA4 and transistor TR14 are set operative. In this case, the emitter current ratio between the transistors TR17 and TR18 is 2:1. Since, in this case, the transistor TR16 is rendered non-conductive and the differential amplifier DA3 is set inoperative, so that the input signal to the input terminal IN2 is not amplified and fed through the output circuit OC to the output terminal OUT2.

When the voltages V1 and V2 noted above are set equal, the transistors TR16 and TR19 function as variable current sources. In this case, the collector currents IC16 to IC19 of the transistors TR16 to TR19 are expressed as follows:

$$IC19 = \tfrac{1}{2} \cdot IC16 \tag{14}$$

$$IC18 = \tfrac{1}{2} \cdot IC17 \tag{15}$$

$$IC16 + IC17 + IC18 + IC19 = I5 \tag{16}$$

$$IC16 + IC19 = (3/2) \cdot IC16 \tag{17}$$

and $$IC17 + IC18 = (3/2) \cdot IC17 \tag{18}$$

Assume now that IX and IY are expressed as follows:

$$IC16 + IC19 = IX (0 \leq IX \leq I5)$$

and $$IC17 + IC18 = IY (1 \leq IY \leq I5)$$

then, the following equation is obtained:

$$IX + IY = I5 \tag{19}$$

In the differential amplifier circuit including the differential amplifiers DA3 and DA4 and transistors TR14 and TR15, the following equation is given;

$$IY/IX = \exp \frac{(V1 - V2)}{VT} \tag{20}$$

where VT is a thermal voltage (=kT/q) and is 26 mV when the temperature is 27° C.

From the equations (19) and (20), the following equation is obtained:

$$(I5 - IX) = \exp \frac{(V1 - V2)}{VT} \tag{21}$$

The equation (21) can be rewritten as follows:

$$IX = \frac{I5}{1 + \exp \frac{(V1 - V2)}{VT}} \tag{22}$$

Obviously from the equation (22), IX can be varied in a range of $0 \leq IX \leq I5$ by changing the variable voltage V1. The equation (22) is of course satisfied irrespective of whether the voltage V1 is sufficiently higher than the voltage V2 or the former is sufficiently lower than the latter.

The base potentials VB1 and VB2 of the transistors TR14 and TR15 are given as follows:

$$\begin{aligned} VB1 &= V0 - R7 \cdot \frac{1}{\beta} \left( \frac{IC16}{2} + IC18 \right) \\ &= V0 - \frac{R7}{\beta} \left( \frac{1}{3} IX + \frac{1}{3} (I5 - IX) \right) \\ &= V0 - \frac{R7}{3\beta} \cdot I5 \end{aligned} \tag{23}$$

and $$\begin{aligned} VB2 &= V0 - R8 \cdot \frac{1}{\beta} \left( \frac{IC17}{2} + IC19 \right) \\ &= V0 - \frac{R8}{\beta} \left( \frac{1}{3} (I5 - IX) + \frac{1}{3} IX \right) \\ &= V0 - \frac{R7}{\beta} \cdot I5 \end{aligned} \tag{24}$$

where V0 is the output voltage of the power supply E1.

Obviously from the equations (23) and (24), the base potentials VB1 and VB2 are held constant irrespective of the current IX or variable voltage V1. The emitter voltage of the transistor TR23 of the output circuit OC thus will not be suddenly changed but will substantially remain at a constant value even at the time of the change-over of operation modes. Thus at the change-over of the operation modes, an impulse sound will never be produced from a loudspeaker (not shown) connected to the output terminal OUT2.

Figure 6:
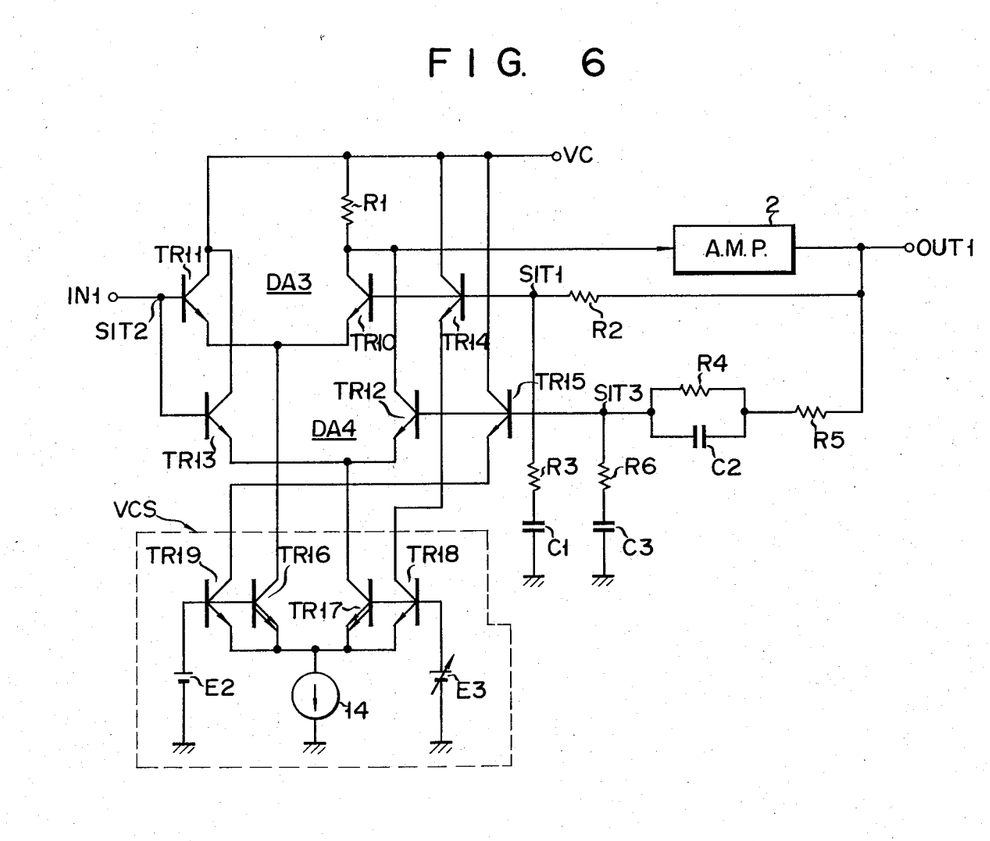
FIG. 6 is a circuit diagram showing a different embodiment of the differential amplifier circuit capable of selectively providing one of two different equalizing characteristics.

FIG. 6 represents an amplifier circuit, which is constructed on the basis of the circuit shown in FIG. 2 and can selectively provide one of two different equalizing characteristics. It is an improvement over the circuit shown in FIG. 1; like parts in the Figure are designated by the same reference numerals.

In this instance, transistors TR10 and TR12 have collectors commonly connected through a resistor R1 to a power supply terminal VC and also to an amplifier 2. Transistors TR11 and TR13 have collectors commonly connected to the power supply terminal VC. The transistors TR10 and TR11 have emitters commonly connected to the collector of a transistor TR16 in a variable current source circuit VCS. The transistors TR12 and TR13 have emitters commonly connected to the collector of a transistor TR17. The transistors TR14 and TR15 have emitters connected to the collectors of respective transistors TR18 and TR19.

In this amplifier circuit, when the output voltage V1 of the DC power supply E3 is sufficiently low compared to the output voltage V2 of the power supply E2, the differential amplifier DA3 and transistor TR15 are set operative. In this case, the base potentials of the transistors TR10, TR11 and TR13 are equal, and an equal base current flows into the base of the transistors TR10 and TR15 as described before in connection with FIG. 4. The potentials on terminals SIT1 and SIT2 thus can be made equal by setting the resistance of a resistor R2 substantially equal to the sum of the resistances of resistors R4 and R5. By so doing, the base potentials on the transistors TR12 and TR13 remain equal even when the differential amplifier DA4 and transistor TR4 are subsequently rendered operative by setting the voltage V1 higher than the voltage V2. Thus abnormal output voltage is not fed through the amplifier 2 to the output terminal OUT1.

Figure 7:
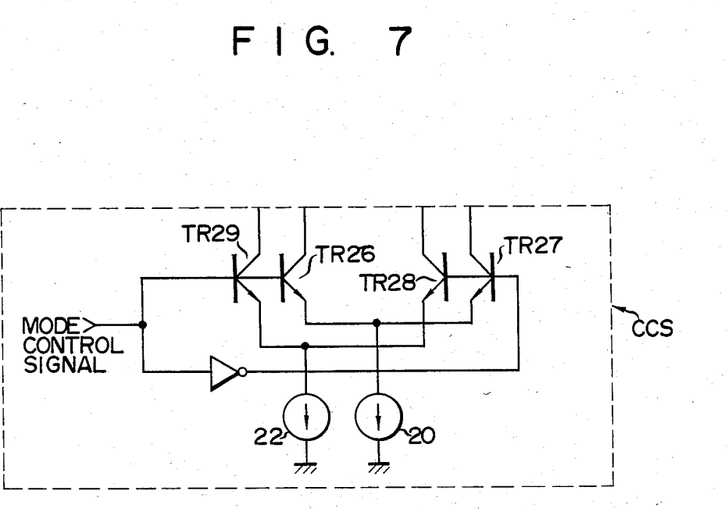
FIG. 7 is a circuit diagram showing a current source circuit which can be used in lieu of variable current source circuits shown in FIGS. 5 and 6.

The embodiments described above were given for the purpose of illustration only and not to restrict the scope of the invention. For example a constant current source circuit CCS as shown in FIG. 7 may be used in lieu of the variable current source circuits VCS shown in FIGS. 5 and 6. This constant current source circuit CCS includes transistors TR26 to TR29 employed instead of the transistors TR16 to TR19 described previously, a constant current source 20 connected to the emitter-collector paths of the transistors TR26 and TR27 and supplying a current of 2I and another constant current source 22 connected to the emitter-collector paths of the transistors TR28 and TR29 and supplying a current of I. A mode control signal for setting an operation mode is supplied to the bases of the transistors TR26 and TR29. A signal obtained through inversion of the mode control signal is supplied to the bases of the transistors TR27 and TR28. The differential amplifier DA3 and transistor TR15 are operative when the mode control signal is at a high level. The differential amplifier DA4 and transistor TR14 are operative when the mode control signal is at a low level.

What is claimed is:
1. A differential amplifier circuit comprising:
   first differential amplifier means having first and second input terminals and an output terminal;
   second differential amplifier means having a first input terminal and an output terminal connected to the first input terminal and output terminal of said first differential amplifier means, respectively, and a second input terminal;

first and second current source means respectively connected to said first and second differential amplifier means, for supplying first and second drive currents to said first and second differential amplifier means, the sum of the first and second drive currents being kept constant;

first and second transistors having bases respectively connected to the second input terminals of said respective first and second differential amplifier means;

third and fourth current source means respectively connected to the emitter-collector paths of said first and second transistors, for supplying third and fourth drive currents in a predetermined ratio to said second and first drive currents, respectively.

2. A differential amplifier circuit according to claim 1, wherein said first to fourth current source means commonly include a constant current source circuit, and said first current source means includes a third transistor having a current path connected between said first differential amplifier means and said constant current source circuit, a predetermined voltage being applied to the base of said third transistor, said second current source means includes a fourth transistor having a current path connected between said second differential amplifier means and said constant current source circuit, a variable voltage being applied to the base of said fourth transistor, said third current source means includes a fifth transistor having a current path connected between said first transistor and said constant current source circuit, said fifth transistor having a base connected to the base of said fourth transistor and an emitter having one half the area of the emitter of said fourth transistor, and said fourth current source means includes a sixth transistor having a current path connected between said second transistor and said constant current source circut, said sixth transistor having a base connected to the base of said third transistor and an emitter having one half the area of the emitter of said third transistor.

3. A differential amplifier circuit according to claim 2, wherein said first differential amplifier means includes seventh and eighth transistors whose emitters are connected to each other, and said second differential amplifier means includes ninth and tenth transistors whose emitters are connected to each other and whose collectors are connected to the collectors of said seventh and eight transistors respectively, the base of said tenth transistor being connected to the base of said eighth transistor.

4. A differential amplifier circuit according to claim 3, which further includes a current mirror circuit having the master current path connected to the collectors of said eighth and tenth transistors and the slave current path connected to the collectors of said seventh and eighth transistors.

5. A differential amplifier circuit according to claim 1, wherein said first differential amplifier means includes third and fourth transistors whose emitters are connected to each other, and said second differential amplifier means includes fifth and sixth transistors whose collectors are connected to the collectors of said third and fourth transistors respectively, the base of said fourth transistor being connected to the base of said second transistor.

6. A differential amplifier circuit according to claim 5, wherein said first and second current source means commonly include a first constant current source circuit for supplying a current of 2I, said first and second current source means respectively include first and second switching means connected to said first constant current source circuit and set in mutually opposite switching positions, said third and fourth current source means commonly include a second constant current source circuit for supplying a current of I, said third and fourth current source means respectively include third and fourth switching means connected to said second constant current source circuit and respectively set in the same switching positions as said second and first switching means.

7. A differential amplifier circuit according to claim 6, wherein said first to fourth switching means are each formed of a switching transistor.

8. A differential amplifier circuit according to claim 1, wherein said first to fourth current source means are respectively formed of first to fourth varible current source circuits for supplying a first drive current of I, a second drive current of $(C-I)$ (C being a constant), a third drive current of $(C-I)/2$ and a fourth drive current of $I/2$ respectively.

* * * * *